(12) United States Patent
Hamada et al.

(10) Patent No.: US 7,187,025 B2
(45) Date of Patent: Mar. 6, 2007

(54) FERROELECTRIC MATERIAL, FERROELECTRIC FILM AND METHOD OF MANUFACTURING THE SAME, FERROELECTRIC CAPACITOR AND METHOD OF MANUFACTURING THE SAME, FERROELECTRIC MEMORY, AND PIEZOELECTRIC DEVICE

(75) Inventors: Yasuaki Hamada, Suwa (JP); Takeshi Kijima, Matsumoto (JP); Junichi Karasawa, Shimosuwa-machi (JP); Koji Ohashi, Chino (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 266 days.

(21) Appl. No.: 10/807,357

(22) Filed: Mar. 24, 2004

(65) Prior Publication Data

US 2004/0245492 A1 Dec. 9, 2004

(30) Foreign Application Priority Data

| Mar. 28, 2003 | (JP) | ............................. 2003-091721 |
| Aug. 27, 2003 | (JP) | ............................. 2003-302902 |
| Jan. 7, 2004 | (JP) | ............................. 2004-002123 |

(51) Int. Cl.
*H01L 29/76* (2006.01)

(52) U.S. Cl. ...................... 257/295; 257/295; 257/296; 257/E21.664

(58) Field of Classification Search ................ 257/295, 257/296, E21.664, E21.663
See application file for complete search history.

(56) References Cited

U.S. PATENT DOCUMENTS

| 5,378,382 A | * | 1/1995 | Nishimura et al. ... 252/62.9 PZ |
| 2004/0136891 A1 | | 7/2004 | Kijima et al. |

FOREIGN PATENT DOCUMENTS

| EP | 1 039 525 A1 * | 11/1997 |
| WO | WO 02/32809 A1 | 4/2002 |

OTHER PUBLICATIONS

U.S. Appl. No. 10/807,427, filed Mar. 24, 2004, Kijima et al.

* cited by examiner

*Primary Examiner*—Andy Huynh
*Assistant Examiner*—Thinh T Nguyen
(74) *Attorney, Agent, or Firm*—Oliff & Berridge, PLC

(57) ABSTRACT

A ferroelectric material for forming a ferroelectric that is described by a general formula $ABO_3$, includes an A-site compensation component which compensates for a vacancy of an A site, and a B-site compensation component which compensates for a vacancy of a B site.

12 Claims, 15 Drawing Sheets

FERROELECTRIC MATERIAL, FERROELECTRIC FILM AND METHOD OF MANUFACTURING THE SAME, FERROELECTRIC CAPACITOR AND METHOD OF MANUFACTURING THE SAME, FERROELECTRIC MEMORY, AND PIEZOELECTRIC DEVICE

Japanese Patent Application No. 2003-91721, filed on Mar. 28, 2003, Japanese Patent Application No. 2003-302902, filed on Aug. 27, 2003, Japanese Patent Application No. 2004-2123, filed on Jan. 7, 2004, are hereby incorporated by reference in their entirety.

BACKGROUND OF THE INVENTION

The present invention relates to a ferroelectric material, a ferroelectric film, a method of manufacturing the same, a ferroelectric capacitor, a method of manufacturing the same, a ferroelectric memory, and a piezoelectric device.

A ferroelectric memory is proposed as an 1C memory. The ferroelectric memory includes a ferroelectric film and is formed by placing the ferroelectric film between a pair of electrodes. The ferroelectric memory retains data by spontaneous polarization. As one type of ferroelectric memory, a simple matrix type ferroelectric memory which uses only a ferroelectric capacitor without using a cell transistor is known. The simple matrix type ferroelectric memory has a very simple structure and enables a higher degree of integration. Therefore, development of such a ferroelectric memory has been expected.

The simple matrix type ferroelectric memory has a problem such as occurrence of crosstalk or disturbance, since a voltage one-half to one-third of the operation voltage must be applied to unselected memory cells. In order to prevent occurrence of such a problem, it is a preferable to apply a ferroelectric film with excellent squareness in which the remanent polarization does not occur, or occurs to only a small extent at a coercive voltage or lower and the remanent polarization is saturated at a small voltage at the operating voltage equal to or higher than the coercive voltage.

BRIEF SUMMARY OF THE INVENTION

The present invention may provide a ferroelectric material for forming a ferroelectric film having hysteresis characteristics with excellent squareness loop which can be suitably used for the simple matrix type ferroelectric memory. The present invention may further provide a ferroelectric film having hysteresis characteristics with excellent squareness loop and a method of manufacturing the same. The present invention may further provide a ferroelectric capacitor including the ferroelectric film, a method of manufacturing the same, a ferroelectric memory, and a piezoelectric device.

One aspect of the present invention relates to a ferroelectric material for forming a ferroelectric that is described by a general formula $ABO_3$, the ferroelectric material comprising an A-site compensation component which compensates for a vacancy of an A site, and a B-site compensation component which compensates for a vacancy of a B site.

DETAILED DESCRIPTION OF THE EMBODIMENT

Figure 1A:
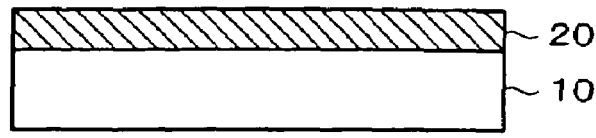
FIGS. 1A to 1E are cross-sectional views showing manufacturing steps of a ferroelectric capacitor according to an embodiment of the present invention.

A ferroelectric material according to one embodiment of the present invention is a ferroelectric material for forming a ferroelectric that is described by a general formula $ABO_3$, and the ferroelectric material includes an A-site compensation component which compensates for a vacancy of an A site, and a B-site compensation component which compensates for a vacancy of a B site.

This ferroelectric material includes the A-site compensation component and the B-site compensation component. Therefore, components for compensating for a vacancy due to vaporization of the constituent component by a heat treatment for crystallization are added to the A site and the B site. As a result, a ferroelectric film having an excellent crystal structure can be provided by forming a ferroelectric film by using the ferroelectric material according to this embodiment of the present invention.

This ferroelectric material may further include the following features.

With this ferroelectric material, each of the A-site compensation component and the B-site compensation component may be an oxide which includes Si or Ge in constituent elements or an oxide which includes Si and Ge in constituent elements.

According to this feature, a part of the constituent elements of the complex oxide is replaced by the constituent element of an oxide that includes Si or Ge or an oxide that includes Si and Ge during the crystallization process of the complex oxide, whereby the crystallization temperature can be reduced. This feature has another advantage. The crystallization temperature generally increases if the compensation components are added to sufficiently compensate for a vacancy of the constituent component of the ferroelectric film. However, the ferroelectric film can be crystallized at low temperature by adding compensation components according to this feature. As a result, a ferroelectric material which can form a ferroelectric film having a more excellent crystal structure can be provided.

This ferroelectric memory device may include constituent elements for lead zirconate titanate, and an element which becomes a divalent state and an element which becomes a trivalent state may be added as the A-site compensation component.

According to this feature, a vacancy of lead in the A site of lead zirconate titanate can be compensated. Moreover, since the divalent element functions to compensate for a vacancy of the A site (lead vacancy) and contributes to make the surface of the ferroelectric film smooth, a ferroelectric material which can form a ferroelectric film having an excellent interface with electrodes can be provided.

With this ferroelectric material, an element which becomes a pentavalent state may be added as the B-site compensation component.

With this ferroelectric material, a lanthanoid series element may be added as the element which becomes a trivalent state.

A method of manufacturing a ferroelectric film according to another embodiment of present invention includes:

forming a ferroelectric material film by stacking a plurality of raw material layers using the above ferroelectric material; and performing a heat treatment for forming initial crystal nuclei in each of the raw material layers.

According to this method of manufacturing a ferroelectric film, the ferroelectric material film is formed by forming one of the raw material layers, performing the heat treatment for forming initial crystal nuclei in the raw material layer, and forming the other raw material layer. Therefore, initial crystal nuclei can be formed in each of the raw material layers more excellently than the case of causing initial crystal nuclei to be grown at the same time in the ferroelectric material film in which a plurality of raw material layers are stacked. As a result, a crystal can be excellently grown in a heat treatment performed later, whereby a ferroelectric film having an excellent crystal structure can be manufactured.

This method of manufacturing a ferroelectric film may include the following features.

With this method of manufacturing a ferroelectric film, the heat treatment may be performed by using a rapid thermal annealing method.

According to this feature, a ferroelectric film having a highly oriented crystal structure can be obtained by performing the heat treatment using the rapid thermal annealing method, in which the raw material layer is rapidly heated at about 50 degrees per second or more.

With this method of manufacturing a ferroelectric film, the ferroelectric film may be formed by crystallizing the ferroelectric material film by applying a heat treatment to the ferroelectric material film.

A method of manufacturing a ferroelectric capacitor according to a further embodiment of the present invention including forming a lower electrode, a ferroelectric film and an upper electrode on a base, the method includes:

forming a ferroelectric material film by stacking a plurality of raw material layers using the above ferroelectric material; and performing a heat treatment for forming initial crystal nuclei in each of the raw material layers.

According to this method, the ferroelectric material film is formed by forming one of the raw material layers, performing the heat treatment for forming initial crystal nuclei in the raw material layer, and forming the other raw material layer. Therefore, initial crystal nuclei can be formed in each of the raw material layers more excellently than the case of causing initial crystal nuclei to be grown at the same time in the ferroelectric material film in which a plurality of raw material layers are stacked. As a result, a ferroelectric capacitor including a ferroelectric film having an excellent crystal structure grown by a heat treatment performed later can be manufactured.

This method of manufacturing a ferroelectric capacitor may include the following features.

With this method of manufacturing the ferroelectric capacitor, the heat treatment may be performed by using a rapid thermal annealing method.

According to this feature, a ferroelectric capacitor having a highly oriented crystal structure can be obtained by performing the heat treatment using the rapid thermal annealing method, in which the raw material layer is rapidly heated at about 50 degrees per second or more.

With this method of manufacturing a ferroelectric capacitor, the ferroelectric film may be formed by crystallizing the ferroelectric material film by applying a heat treatment to the ferroelectric material film.

A ferroelectric capacitor according to a still further embodiment of the present invention is manufactured by using the above method of manufacturing a ferroelectric capacitor. Therefore, a ferroelectric capacitor having excellent characteristics can be provided.

A ferroelectric memory according to an even further embodiment of the present invention includes the above ferroelectric capacitor. Therefore, a highly reliable ferroelectric memory can be provided.

A piezoelectric device according to a yet further embodiment of the present invention includes the above ferroelectric capacitor. Therefore, a highly reliable piezoelectric device can be provided.

An example of the embodiment of the present invention is described below in more detail with reference to the drawings.

1. Ferroelectric Material

A ferroelectric material according to the present embodiment includes a raw material liquid which includes an ABO-type oxide, an A-site compensation component which compensates for a vacancy of an A site, and a B-site compensation component which compensates for a vacancy of a B site.

The A-site compensation component includes an element which functions to compensate for a vacancy of the A site when manufacturing a ferroelectric film by using the ferroelectric material according to the present embodiment. In the case where the ABO-type oxide is lead zirconate titanate, the A-site compensation component includes an element which can become a divalent state, and an element which can become a trivalent state.

An element which can be in a trivalent state included in the A-site compensation component functions to compensate for a vacancy of the A site such as a lead vacancy. As examples of such a trivalent element, lanthanoid series elements can be given. For example, La, Nd, Sm, or the like is used. The trivalent element is added in an amount of preferably 1 mol % to 30 mol %, and still more preferably 1 mol % to 20 mol % of the constituent element of the A site. If the amount of the trivalent element is less than 1 mol %, it is insufficient to compensate for a lead vacancy. If the amount of the trivalent element exceeds 30 mol %, the balance of the material system is lost, whereby a stable crystallization state cannot be obtained.

An element which can be in a divalent state included in the A-site compensation component functions to compensate for a vacancy of the A site (lead vacancy) in the same manner as the trivalent element, and makes the plane of the crystal structure flat and smooth. Therefore, in the case of forming a ferroelectric capacitor, the interface between the ferroelectric film and electrodes can be improved. As the element which can be in a divalent state, Ca, Sr, Ba, Be, or the like is used. The divalent element is preferably added in an amount of 1 mol % to 30 mol % of the constituent element of the A site. If the amount of the divalent element to be added is less than 1 mol %, the divalent element cannot sufficiently function to compensate for the lead vacancy and make the plane flat and smooth. If the amount of the divalent element exceeds 30 mol %, the balance of the material system is lost, whereby a stable crystallization state cannot be obtained.

The B-site compensation component includes an element which functions to compensate for a vacancy of the B site when manufacturing a ferroelectric film by using the ferroelectric material according to the present embodiment. In the case where the ABO-type oxide is lead zirconate titanate, an element which can compensate for release of Ti in the B site and has an atomic radius close to the atomic radius of Ti can be given as such an element. As specific examples, Ta, Nb, and the like can be given. In this case, a charge is compensated in the case where Pb in the A site is released by allowing Nb (pentavalent) to compensate for a vacancy of Ti in the B site. The same effect as that of Nb can be obtained by using W, Mo, or V. The similar effect can be obtained by using Mn. The B-site compensation component is preferably added in an amount of 1 mol % to 30 mol % of the constituent element of the B site. If the amount of the B-site compensation component is less than 1 mol %, the B-site compensation component cannot sufficiently function to compensate for a vacancy of the B site. If the amount of the B-site compensation component exceeds 30 mol %, the balance of the material system is lost, whereby a stable crystallization state cannot be obtained.

The total amount of the A-site compensation component and the B-site compensation component to be added is preferably 5 mol % to 40 mol % of the constituent elements of the ferroelectric film.

If the total amount of the compensation components is too small, a sufficient effect on reliability, which is the effect of the present invention, cannot be obtained. In the case where the amount of Pb is significantly smaller than that of the stoichiometric composition, since spontaneous polarization becomes small, an expected polarization cannot be secured even though reliability is improved. Therefore, the total amount of the A site substitution elements to be added must be limited to 30 mol % or less. This also applies to the B-site compensation component. If the amount of elements to be added is too great, the elements may form an oxide. In this case, a paraelectric layer is interposed between the ferroelectric layers, thereby resulting in deterioration of characteristics. Therefore, a too great amount of addition causes adverse effects.

As described above, the A-site compensation component which includes a divalent element and a trivalent element and the B-site compensation component which includes an element which can become a pentavalent state are added to the ferroelectric material according to the present embodiment. Therefore, a vacancy of the A site and a vacancy of the B site can be compensated at the same time. As a result, a ferroelectric material which can form a ferroelectric film having an excellent crystal structure can be provided. Moreover, since the divalent element used as the A-site compensation component functions to compensate for a vacancy of the A site (lead vacancy, for example) and contributes to make the surface of the ferroelectric film flat, a ferroelectric material which can form a ferroelectric film having an excellent crystal interface with electrodes can be provided.

The A-site compensation component and the B-site compensation component are preferably added as an oxide which includes Si or Ge in the constituent elements or an oxide which includes Si and Ge in the constituent elements. As examples of the oxide which includes Si or Ge or the oxide which includes Si and Ge used as the A-site compensation component, $CaSiO_3$, $SrSiO_3$, $BaSiO_3$, $BeSiO_3$, $CaGeO_3$, $SrGeO_3$, $LaGe_2O_5$, and the like can be given. As examples of the oxide used as the B-site compensation component, $TaSiO_4$, $NbSiO_4$, and the like can be given.

Crystallization can be performed at low temperature when manufacturing a ferroelectric film by using the ferroelectric material including the oxide which includes Si or Ge in the constituent elements or the oxide which includes Si and Ge in the constituent elements as in the present embodiment. The crystallization temperature generally increases if the compensation components are added to sufficiently compensate for a vacancy of the constituent component of the ferroelectric film. However, according to the present embodiment, since the compensation components are added as a complex oxide of Si or Ge or the like, crystallization can be performed at low temperature even if the compensation components are added in an amount sufficient to compensate for a vacancy. Therefore, the compensation components can be included in the ferroelectric material in an amount sufficient to compensate for a vacancy, whereby a ferroelectric material which can form a ferroelectric film having an excellent crystal structure can be provided.

2. Method of Manufacturing Ferroelectric Capacitor

Manufacturing steps of a ferroelectric capacitor using the ferroelectric material according to the present embodiment are described below with reference to FIGS. 1A to 1E.

As shown in FIG. 1A, a lower electrode 20 is formed on a base 10. The lower electrode 20 may be formed of a material such as a metal (Pt, Ir, Al, Au, Ag, Ru, or Sr, for example), an oxide conductor ($IrO_x$, for example), or a nitride conductor (TiN, for example) by using a sputtering method. The lower electrode 20 may be either a single-layer film or a stacked multilayer film.

Figure 1B:
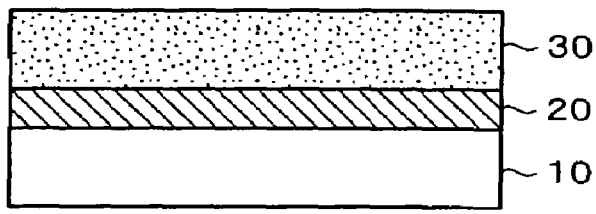

As shown in FIG. 1B, a ferroelectric material film 30 is formed on the lower electrode 20 by using the above-described ferroelectric material. As a method of forming the ferroelectric material film 30, a coating method and an LSMCD method can be given. As examples of the coating method, a spin coating method and a dipping method can be given. The ferroelectric material film 30 may be formed by using a mixed raw material of a sol-gel raw material and an MOD raw material. As the sol-gel raw material, a raw material having a crystallization temperature lower than that of the MOD raw material and a crystal nucleus formation rate and a crystal growth rate higher than those of the MOD raw material is preferably selected.

Figure 1C:
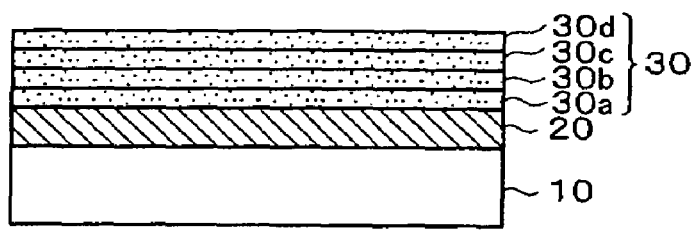

In the case of forming the ferroelectric material film 30 in two or more stages, the ferroelectric material film 30 may be formed as described below. As shown in FIG. 1C, a raw material layer 30a in a first layer is formed, dried, and presintered. Initial crystal nuclei are formed for allowing a crystal to be excellently grown in a heat treatment described later. The crystal nuclei may be formed by using a rapid thermal annealing (RTA) method, for example. After forming a raw material layer 30b in a second layer on the raw material layer 30a in which the initial nuclei are formed, crystal nuclei are formed in the raw material layer 30b. A raw material layer 30c in a third layer and a raw material layer 30d in a fourth layer are formed in the same manner as described above, whereby the raw material layers 30a to 30d are stacked to obtain the ferroelectric material film 30 with a desired thickness. The ferroelectric material film 30 is formed by arbitrarily setting the number of raw material layers that are stacked.

Figure 1D:
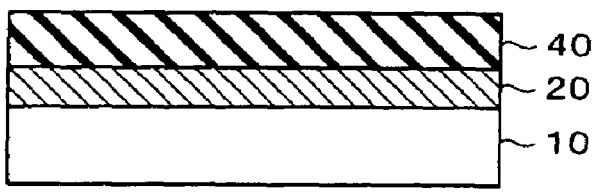

As shown in FIG. 1D, the ferroelectric material film 30 is crystallized by subjecting the ferroelectric material film 30 to a heat treatment to form a ferroelectric film 40. The heat treatment may be performed by using an RTA method, for example.

Figure 1E:
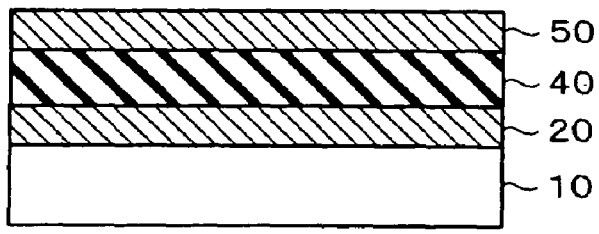

As shown in FIG. 1E, an upper electrode 50 is formed on the ferroelectric film 40 to obtain a ferroelectric capacitor. As the material and the formation method for the upper electrode 50, the material and the formation method for the lower electrode 20 may be applied.

According to the method of manufacturing a ferroelectric capacitor of the present embodiment, a ferroelectric capacitor is manufactured by using the ferroelectric material including the A-site compensation component and the B-site compensation component. Therefore, a ferroelectric film having an excellent crystal state can be formed, whereby a ferroelectric capacitor having excellent hysteresis characteristics can be manufactured.

The ferroelectric material film 30 can be formed by the step shown in FIG. 1C. Therefore, the ferroelectric material film 30 in which a larger number of initial crystal nuclei are formed in the raw material layer in the lower layer can be formed. Specifically, the ferroelectric material film 30 has an initial crystal nucleus concentration gradient in the direction of the film thickness. Therefore, initial crystal nuclei sufficient to secure excellent crystal growth in a heat treatment performed later are formed in each of the layers of the ferroelectric material film 30, whereby the entire ferroelectric film can be uniformly crystallized. As a result, a ferroelectric capacitor having excellent hysteresis characteristics can be manufactured.

In the method of manufacturing a ferroelectric capacitor of the present embodiment, after forming the upper electrode 50 on the base 10, a heat treatment for recovering the ferroelectric characteristics may be performed as post annealing at a pressure of two atmospheres or more. This improves the interfacial state between the ferroelectric film 40 and the upper electrode 50 and the lower electrode 20, whereby the ferroelectric characteristics can be recovered.

In the method of manufacturing a ferroelectric capacitor of the present embodiment, the ferroelectric capacitor may be patterned by etching or the like after forming the upper electrode 50 on the base 10, and a heat treatment for recovering the ferroelectric characteristics may be performed as post annealing at a pressure of two atmospheres or more. This enables the ferroelectric capacitor to recover from process damage in the etching step.

The post annealing may be performed by slowly heating the ferroelectric capacitor using a furnace annealing (FA) method, or by rapidly heating the ferroelectric capacitor using an RTA method.

The above-described heat treatment may be performed in an atmosphere such as a gas inert to vaporization of the metal material which makes up the complex oxide, such as nitrogen, argon, or xenon. The effect of preventing vaporization of the metal material which makes up the complex oxide can be further increased by performing the heat treatment in such an atmosphere.

Pressurization in a plurality of stages may be performed in at least either the temperature raising process or the temperature lowering process of the heat treatment.

Detailed examples of the manufacturing method according to the present embodiment are described below.

FIRST EXAMPLE

Figure 2:
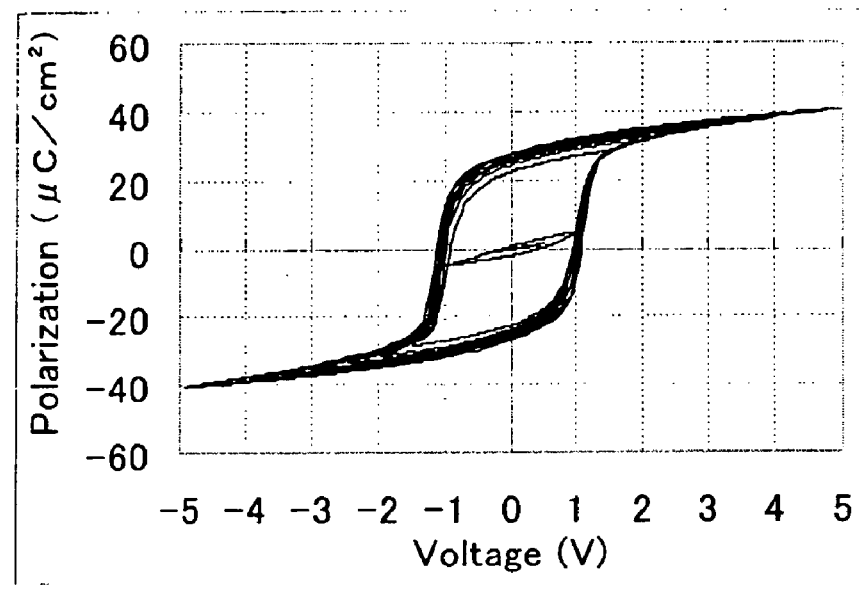
FIG. 2 shows hysteresis characteristics of a ferroelectric capacitor according to an example of the embodiment.
Figure 7:
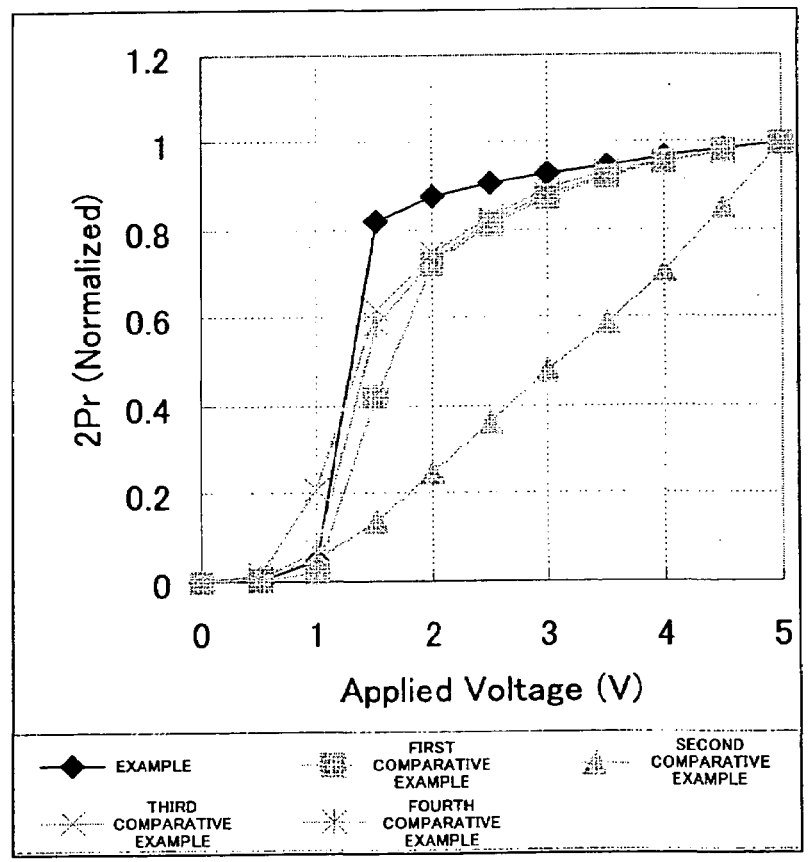
FIG. 7 is a graph showing polarization values of ferroelectric capacitors of the example and the first to fourth comparative examples.

A base in which a Pt electrode was formed as a lower electrode was provided. A ferroelectric material including PZT (120/20/80), divalent Ca in an amount of 2 mol % of the constituent component of the A site and trivalent La in an amount of 1.25 mol % of the constituent component of the A site as the A-site compensation component, and Nb as the B-site compensation component in an amount of 1.25 mol % of the constituent component of the B site was used. A raw material layer in a first layer was formed by using a spin coating method, and dried by performing a heat treatment at 150° C. for two minutes and at 250° C. for five minutes. The raw material layer was heated at 650° C. for 10 minutes by using an RTA method to form initial crystal nuclei. A ferroelectric material film with a thickness of 200 nm was formed by repeating the above step four times. A heat treatment for crystallization was then performed to form a ferroelectric film. A Pt electrode was formed as an upper electrode to obtain a ferroelectric capacitor according to this example. FIG. 2 shows hysteresis characteristics of the ferroelectric capacitor according to this example, and FIG. 7 shows results for saturation characteristics.

FIRST COMPARATIVE EXAMPLE

Figure 3:
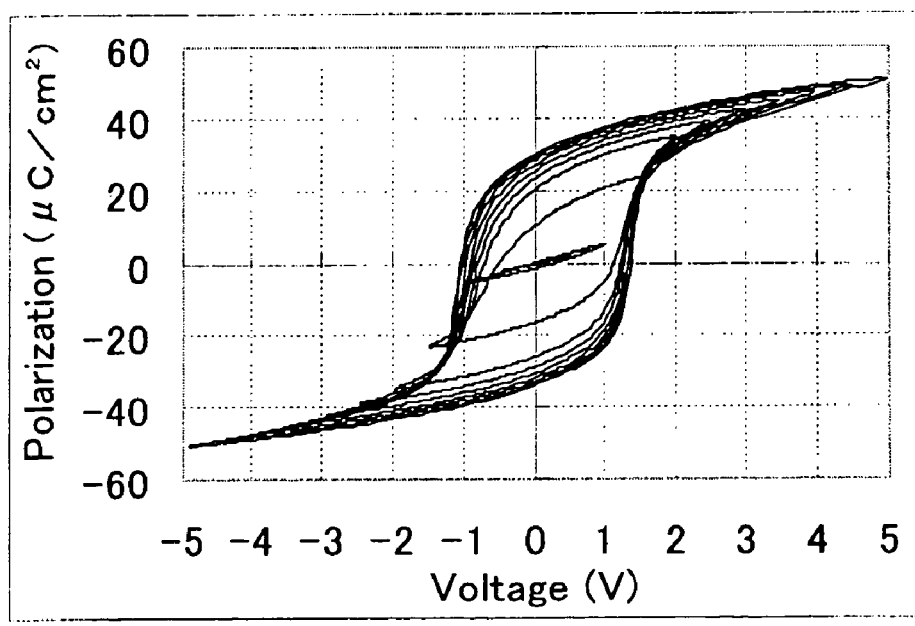
FIG. 3 shows hysteresis characteristics of a ferroelectric capacitor according to a first comparative example.

A ferroelectric material in which the compensation component was not added to PZT (120/20/80) was used. A ferroelectric capacitor was manufactured by the same steps as in a first example. FIG. 3 shows hysteresis characteristics of the ferroelectric capacitor according to a first comparative example, and FIG. 7 shows results for saturation characteristics.

SECOND COMPARATIVE EXAMPLE

Figure 4:
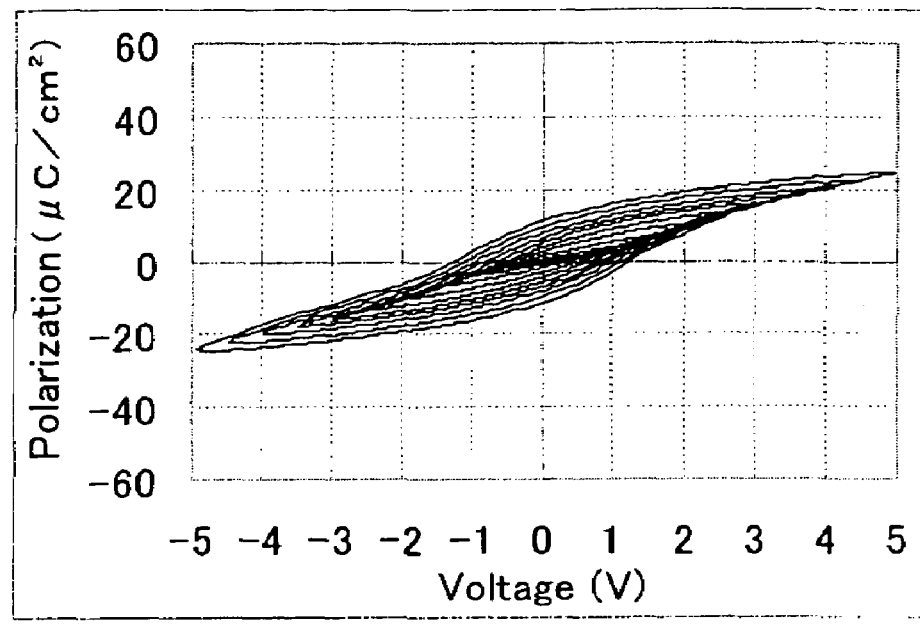
FIG. 4 shows hysteresis characteristics of a ferroelectric capacitor according to a second comparative example.

A ferroelectric material including PZT (120/20/80) and divalent Ca as the A-site compensation component in an amount of 5% of the constituent component of the A site was used. A ferroelectric capacitor was manufactured by the same steps as in the first example. FIG. 4 shows hysteresis characteristics of the ferroelectric capacitor according to a second comparative example, and FIG. 7 shows results for saturation characteristics.

THIRD COMPARATIVE EXAMPLE

Figure 5:
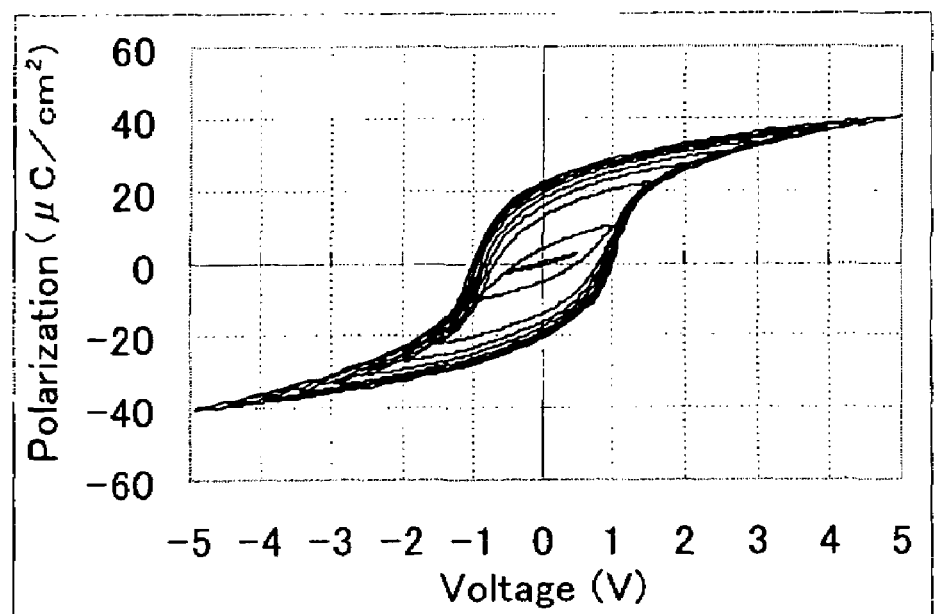
FIG. 5 shows hysteresis characteristics of a ferroelectric capacitor according to a third comparative example.

A ferroelectric material including PZT (120/20/80), and divalent Ca in an amount of 3.3% of the constituent component of the A site and trivalent La in an amount of 1.7% of the constituent component of the A site as the A-site compensation component was used. A ferroelectric capacitor was manufactured by the same steps as in the first example. FIG. 5 shows hysteresis characteristics of the ferroelectric capacitor according to a third comparative example, and FIG. 7 shows results for saturation characteristics.

FOURTH COMPARATIVE EXAMPLE

Figure 6:
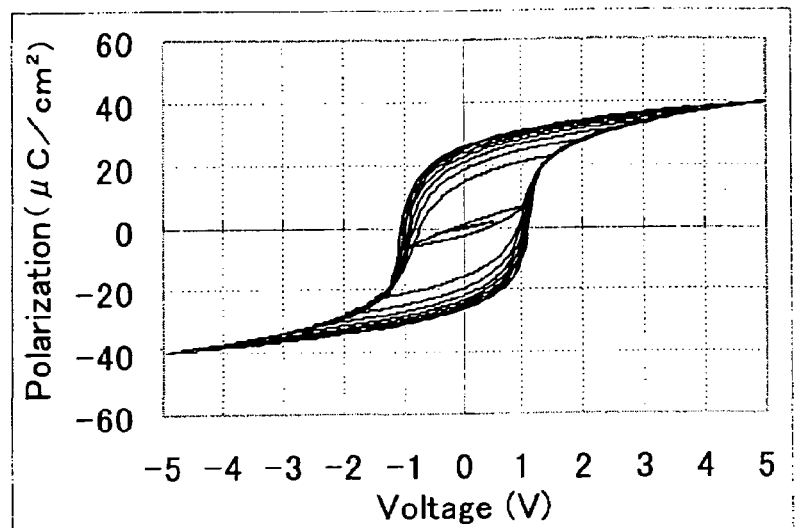
FIG. 6 shows hysteresis characteristics of a ferroelectric capacitor according to a fourth comparative example.

A ferroelectric material including PZT (120/20/80), divalent Ca as the A-site compensation component in an amount of 3.3% of the constituent component of the A site, and Nb as the B-site compensation component in an amount of 1.7% of the constituent component of the B site was used. A ferroelectric capacitor was manufactured by the same steps as in the first example. FIG. 6 shows hysteresis characteristics of the ferroelectric capacitor according to a fourth comparative example, and FIG. 7 shows results for saturation characteristics.

FIFTH COMPARATIVE EXAMPLE

Figure 8:
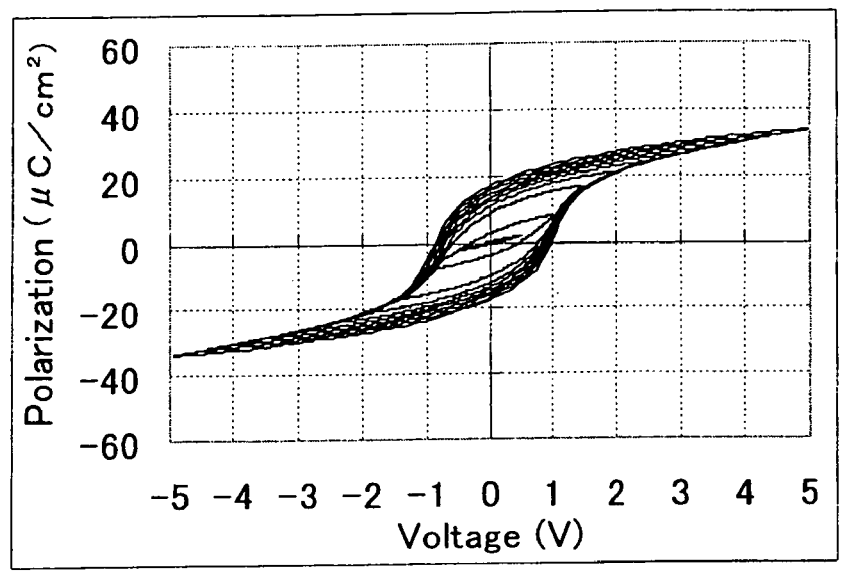
FIG. 8 shows hysteresis characteristics of a ferroelectric capacitor according to a fifth comparative example.
Figure 9:
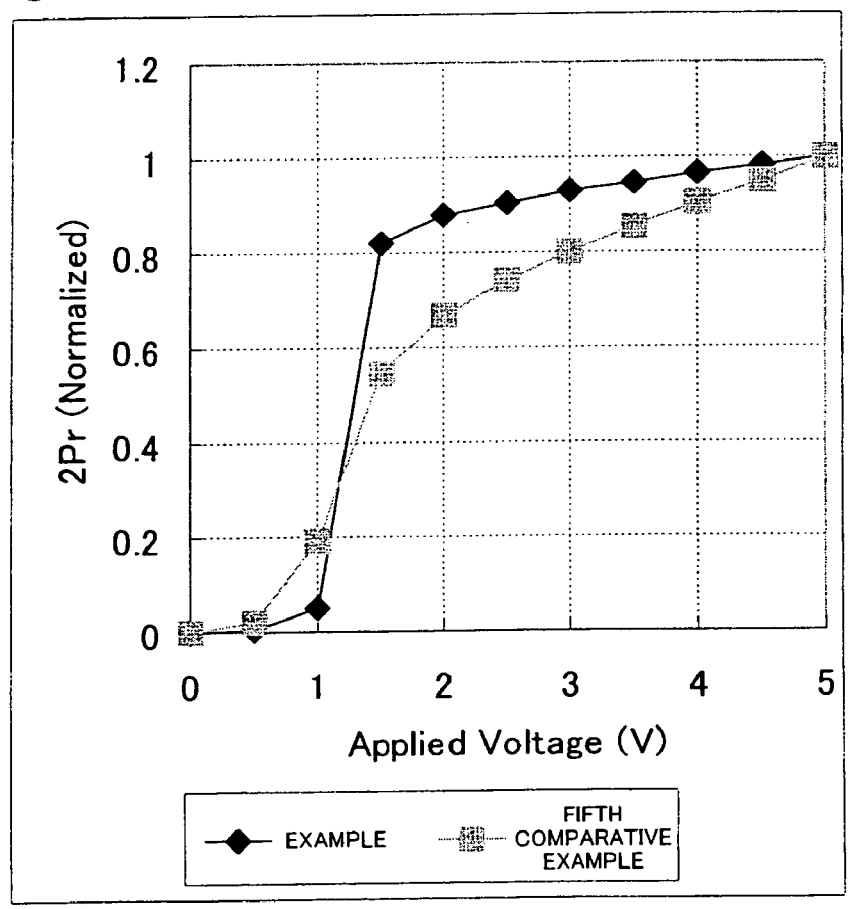
FIG. 9 shows fatigue characteristics of ferroelectric capacitors according to the example and a fifth comparative example.

A base on which a Pt electrode was formed as a lower electrode was provided. A ferroelectric material including PZT (120/20/80), divalent Ca in an amount of 2.5 mol % of the constituent component of the A site and trivalent La in an amount of 1.25 mol % of the constituent component of the A site as the A-site compensation component, and Nb as the B-site compensation component in an amount of 1.25 mol % of the constituent component of the B site was used. A ferroelectric material film was repeatedly formed using a spin coating method four times to form a raw material layer with a thickness of about 200 nm. A heat treatment for crystallization was performed to form a ferroelectric film. A Pt electrode was formed as an upper electrode to form a ferroelectric capacitor according to a sixth comparative example. FIG. 8 shows hysteresis characteristics of the ferroelectric capacitor according to a fifth comparative example, and FIG. 9 shows results for saturation characteristics.

SIXTH COMPARATIVE EXAMPLE

Figure 10:
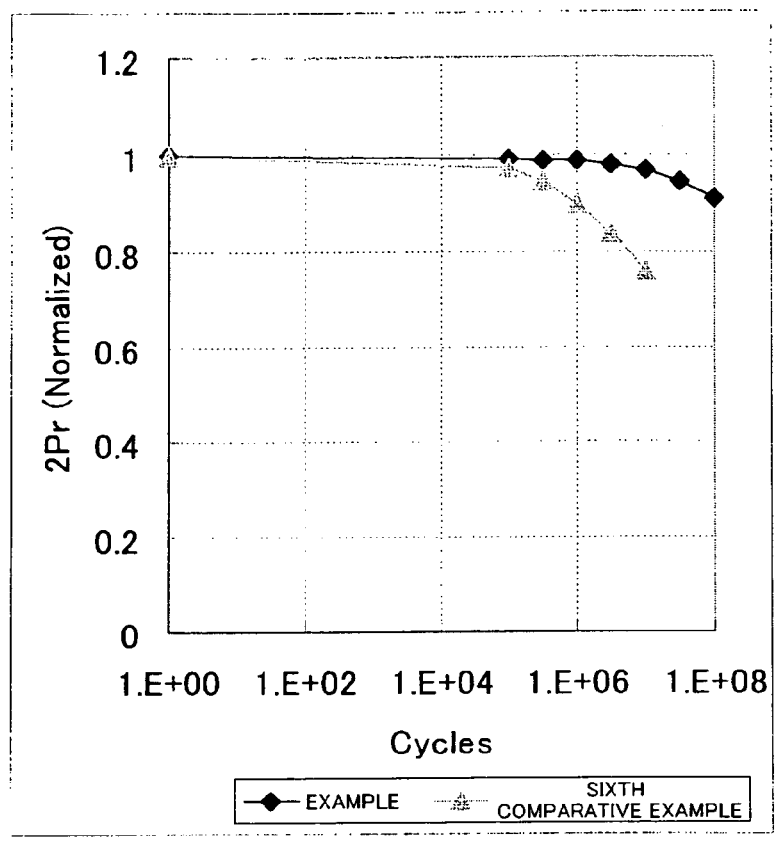
FIG. 10 shows fatigue characteristics of ferroelectric capacitors according to the example and a sixth comparative example.

A ferroelectric material including PZT (120/20/80), divalent Ca in an amount of 0.5 mol % of the constituent component of the A site and trivalent La in an amount of 0.25 mol % of the constituent component of the A site as the A-site compensation component, and Nb as the B-site compensation component in an amount of 0.25 mol % of the constituent component of the B site was used. The total amount of the A-site compensation component and the B-site compensation component was 1 mol % or less of PZT. A ferroelectric capacitor was manufactured by the same steps as in the first example. FIG. 10 shows measurement results for fatigue characteristics of the ferroelectric capacitor according to this comparative example together with results for fatigue characteristics in the first example.

Evaluation

As is clear from comparison between FIG. 2, which shows hysteresis characteristics according to the first example, and FIGS. 3 to 6, which show hysteresis characteristics according to the first to fourth comparative examples, it was found that the ferroelectric capacitor obtained by the manufacturing method of the first example had a hysteresis shape with excellent squareness. FIG. 7 is a graph showing saturation characteristics obtained in the first example and the first to fourth comparative examples. As is clear from FIG. 7, it was confirmed that the ferroelectric capacitor according to the first example was saturated at a low voltage of 2 V or less and exhibited excellent characteristics.

As is clear from FIGS. 8 and 9, it was found that deterioration of the characteristics of the ferroelectric film was observed in the case where the heat treatment for forming initial crystal nuclei was not performed between formation of the raw material layer in the first layer and formation of the raw material layer in the second layer in the step of forming a ferroelectric material film. The reason therefor is considered to be because the initial crystal nucleus concentration gradient could not be formed in the ferroelectric material film, whereby a uniform crystal structure could not be formed.

As is clear from FIG. 10, even if all the elements of the A-site compensation component and the B-site compensation component were added, excellent hysteresis characteristics could not be obtained if the amount of elements was small. Therefore, it was confirmed that the total amount of the A-site compensation component and the B-site compensation component to be added is preferably 5 mol % of PZT.

SECOND EXAMPLE

In this example, influence of addition of a trivalent element and a pentavalent element to PZT on reliability characteristics was examined.

Figure 11:
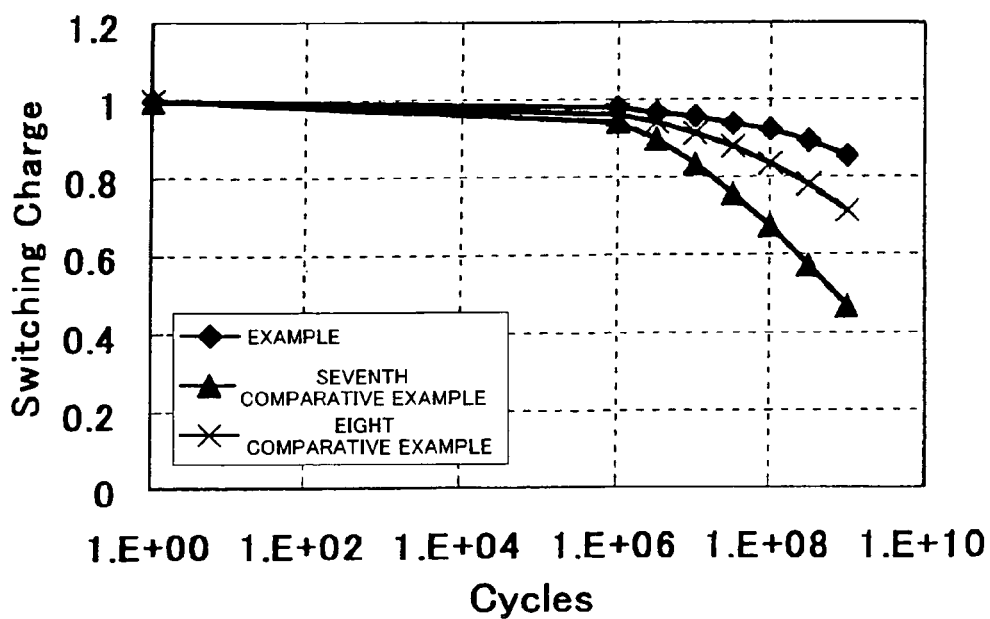
FIG. 11 shows fatigue characteristics of ferroelectric capacitors according to the example and seventh and eighth comparative examples.

In this example, fatigue characteristics of a specimen were examined using a ferroelectric material including PZT (110/20/80), an La component as the A-site compensation component in an amount of 5 at % of the Pb content, and an Nb component as the B-site compensation component in amount of 20 at % of the sum of the Zr content and the Ti content. As a comparative example, fatigue characteristics were examined for a specimen in which only an La component was added to PZT (110/20/80) as the A-site compensation component in the same amount as that in this example (seventh comparative example), and a specimen in which only an Nb component was added as the B-site compensation component in the same amount as that in this example (eighth comparative example). FIG. 11 shows results for fatigue characteristics of each specimen. As shown in FIG. 11, it was confirmed that the specimen according to this example exhibited excellent fatigue characteristics in comparison with the specimens according to the seventh and eighth comparative examples, and that sufficient reliability can be secured when the specimen according to this example is applied to a device.

In this example, a PZT ferroelectric material was used as the specimen. However, the above-described reliability improvement effect would be obtained when using a ferroelectric material having Bi layered perovskite structure (BIT, for example).

3. Ferroelectric Memory

3.1 First Ferroelectric Memory

A ferroelectric memory including the ferroelectric capacitor according to the above-described embodiment is described below.

Figure 12:
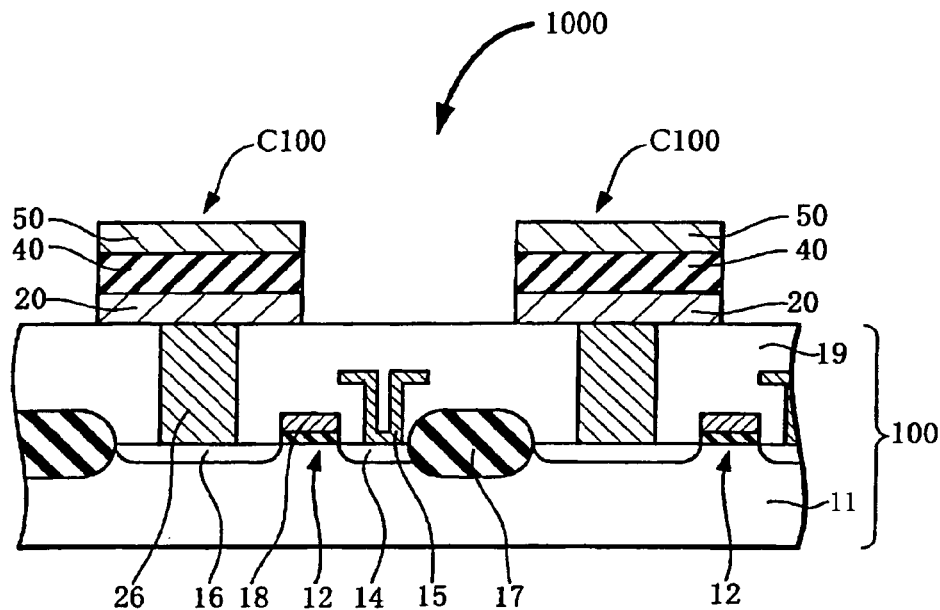
FIG. 12 shows a ferroelectric memory according to a first example of another embodiment of the present invention.

FIG. 12 is a cross-sectional view schematically showing a ferroelectric memory 1000. The ferroelectric memory 1000 includes a transistor formation region for controlling the ferroelectric memory. The transistor formation region corresponds to a base 100.

The base 100 includes a transistor 12 formed on a semiconductor substrate 11. A conventional configuration may be applied to the transistor 12. A thin film transistor (TFT) or MOSFET may be used as the transistor 12. In the example shown in FIG. 12, a MOSFET is used as the transistor 12, and the transistor 12 includes drain/sources 14 and 16 and a gate electrode 18. An electrode 15 is formed on the drain/source 14, and a plug electrode 26 is formed on the drain/source 16. The plug electrode 26 is connected with a first electrode 20 of a ferroelectric capacitor C100 through a barrier layer, if necessary. The memory cells are separated by an element isolation region 17 such as LOCOS or trench isolation. An interlayer dielectric 19 is formed of an insulator such as silicon oxide on the semiconductor substrate 11 on which the transistor 12 and the like are formed.

In the above-described configuration, the structure under the ferroelectric capacitor C100 forms the transistor formation region which is the base 100. In more detail, the transistor formation region is formed of a structure including the transistor 12, the electrodes 15 and 26, and the interlayer dielectric 19 formed on the semiconductor substrate 11. The ferroelectric capacitor C100 manufactured by the above described manufacturing method is formed on the base 100.

The ferroelectric memory 1000 has a structure of storing a charge as data in a storage capacitor in the same manner as the DRAM cell. Specifically, the memory cell includes the transistor and the ferroelectric capacitor, as shown in FIGS. 13 and 14.

Figure 13:
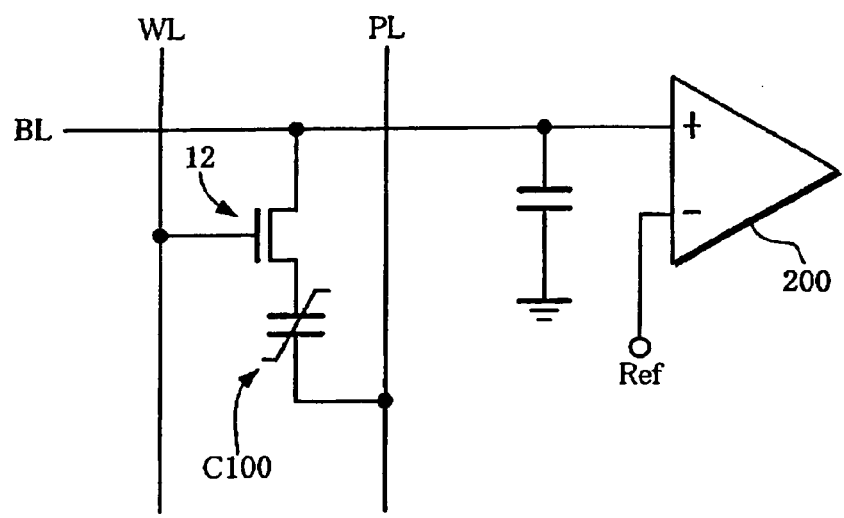
FIG. 13 shows the ferroelectric memory according to the first example of the other embodiment of the present invention.
Figure 14:
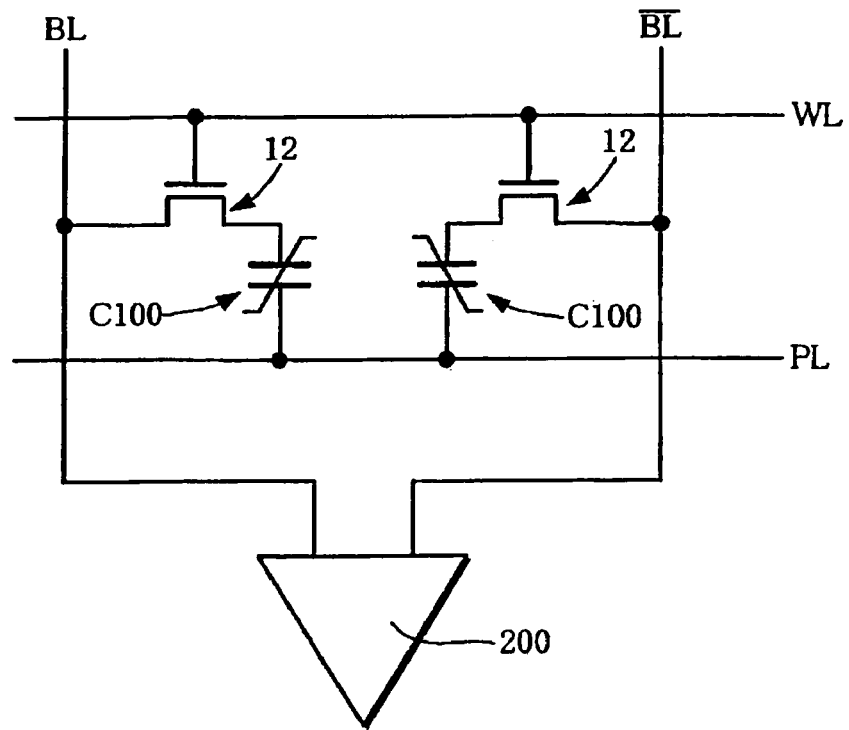
FIG. 14 shows the ferroelectric memory according to the first example of the other embodiment of the present invention.

FIG. 13 shows a 1T1C cell type ferroelectric memory in which the memory cell includes one transistor 12 and one ferroelectric capacitor C100. The memory cell is located at an intersecting point of a wordline WL and a bitline BL. One end of the ferroelectric capacitor C100 is connected with the bitline BL through the transistor 12 which connects or disconnects the ferroelectric capacitor C100 and the bitline BL. The other end of the ferroelectric capacitor C100 is connected with a plate line PL. A gate of the transistor 12 is connected with the wordline WL. The bitline BL is connected with a sense amplifier 200 which amplifies a signal charge.

An example of the operation of the 1T1C cell is described below briefly.

In the read operation, the bitline BL is set at 0 V, and the transistor 12 is turned ON by applying a voltage to the wordline WL. The amount of polarization charge corresponding to data stored in the ferroelectric capacitor C100 is transmitted to the bitline BL by increasing the voltage applied to the plate line PL from 0 V to about a power supply voltage Vcc. The stored data can be read as Vcc or 0 V by amplifying a small potential change generated by the amount of polarization charge using the differential sense amplifier 200.

In the write operation, the transistor 12 is turned ON by applying a voltage to the wordline WL, and the polarization state of the ferroelectric capacitor C100 is changed by applying voltage between the bitline BL and the plate line PL.

FIG. 14 shows a 2T2C cell type memory cell in which the memory cell includes two transistors 12 and two ferroelectric capacitors C100. The 2T2C cell has a structure of retaining complementary data by combining two 1T1C cells described above. In the 2T2C cell, data is detected by inputting complementary signals to the sense amplifier 200 from two memory cells in which data has been complementarily written as two differential inputs. Therefore, since data is written in two ferroelectric capacitors C100 in the 2T2C cell the same number of times, the deterioration state of the ferroelectric films of the ferroelectric capacitors C100 becomes equal, whereby a stable operation can be achieved.

3.2 Second Ferroelectric Memory

Figure 15:
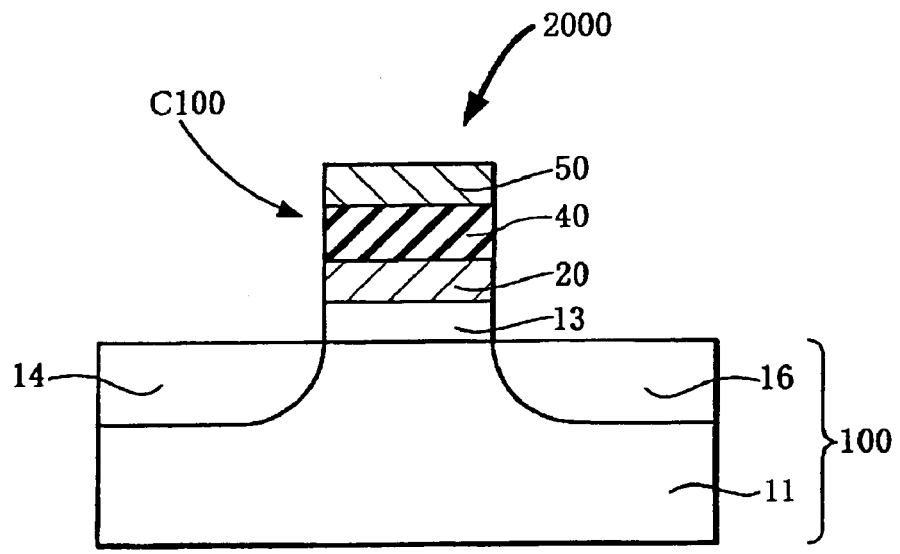
FIG. 15 shows a ferroelectric memory according to a second example of the other embodiment of the present invention.
Figure 16:
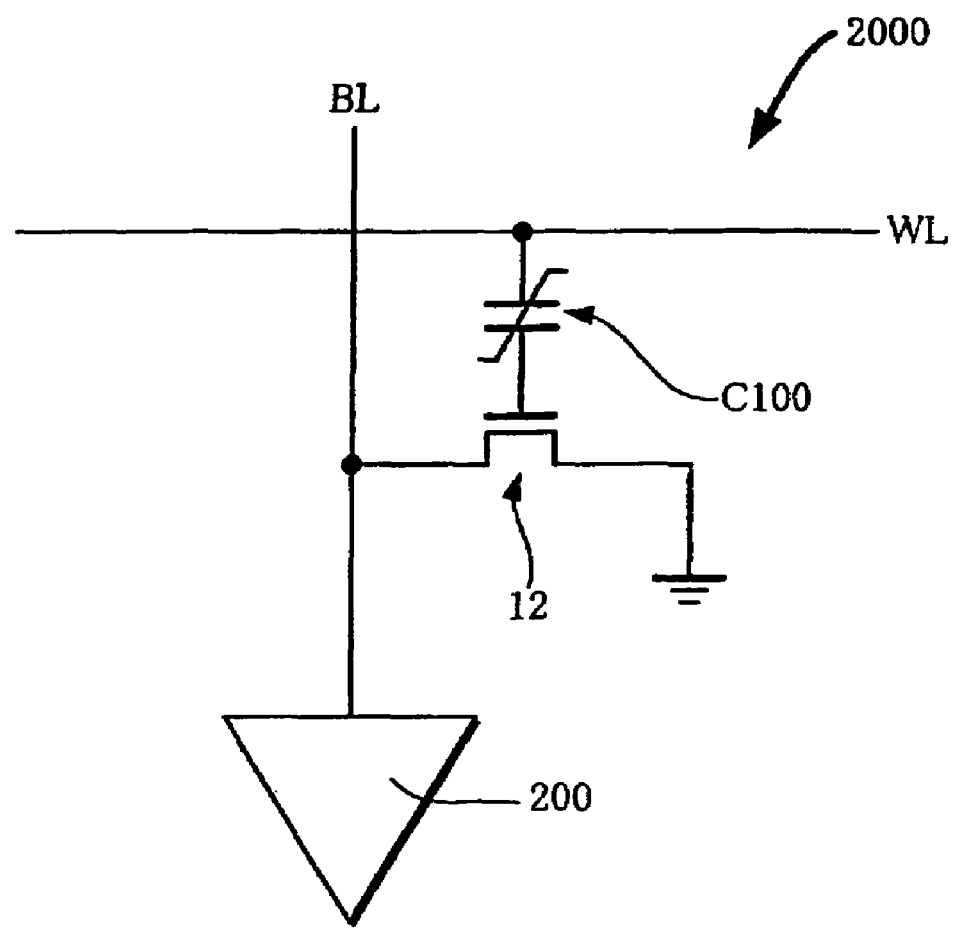
FIG. 16 shows the ferroelectric memory according to the second example of the other embodiment of the present invention.

FIGS. 15 and 16 show a ferroelectric memory 2000 including a MIS transistor type memory cell. The ferroelectric memory 2000 has a structure in which the ferroelectric capacitor C100 is directly connected to a gate insulating layer 13. In more detail, the source/drains 14 and 16 are formed in the semiconductor substrate 11, and the ferroelectric capacitor C100, in which the floating gate electrode (first electrode) 20, the ferroelectric film 40 according to the present invention, and the gate electrode (second electrode) 50 are stacked, is connected to the gate insulating layer 13. As the ferroelectric film 40, a ferroelectric film formed by applying the manufacturing method described in the present embodiment is used. In the ferroelectric memory 2000, the semiconductor substrate 11, the source/drains 14 and 16, and the gate insulating layer 13 correspond to the base 100.

In the ferroelectric memory 2000, the wordline WL is connected with the gate electrode 50 of each cell, and the drain is connected with the bitline BL, as shown in FIG. 16. In this ferroelectric memory, the data write operation is performed by applying an electric field between the wordline WL and the well (source) of the selected cell. The read operation is performed by selecting the wordline WL corresponding to the selected cell, and detecting the amount of current flowing through the transistor using the sense amplifier 200 connected with the bitline BL of the selected cell.

3.3 Third Ferroelectric Memory

Figure 17:
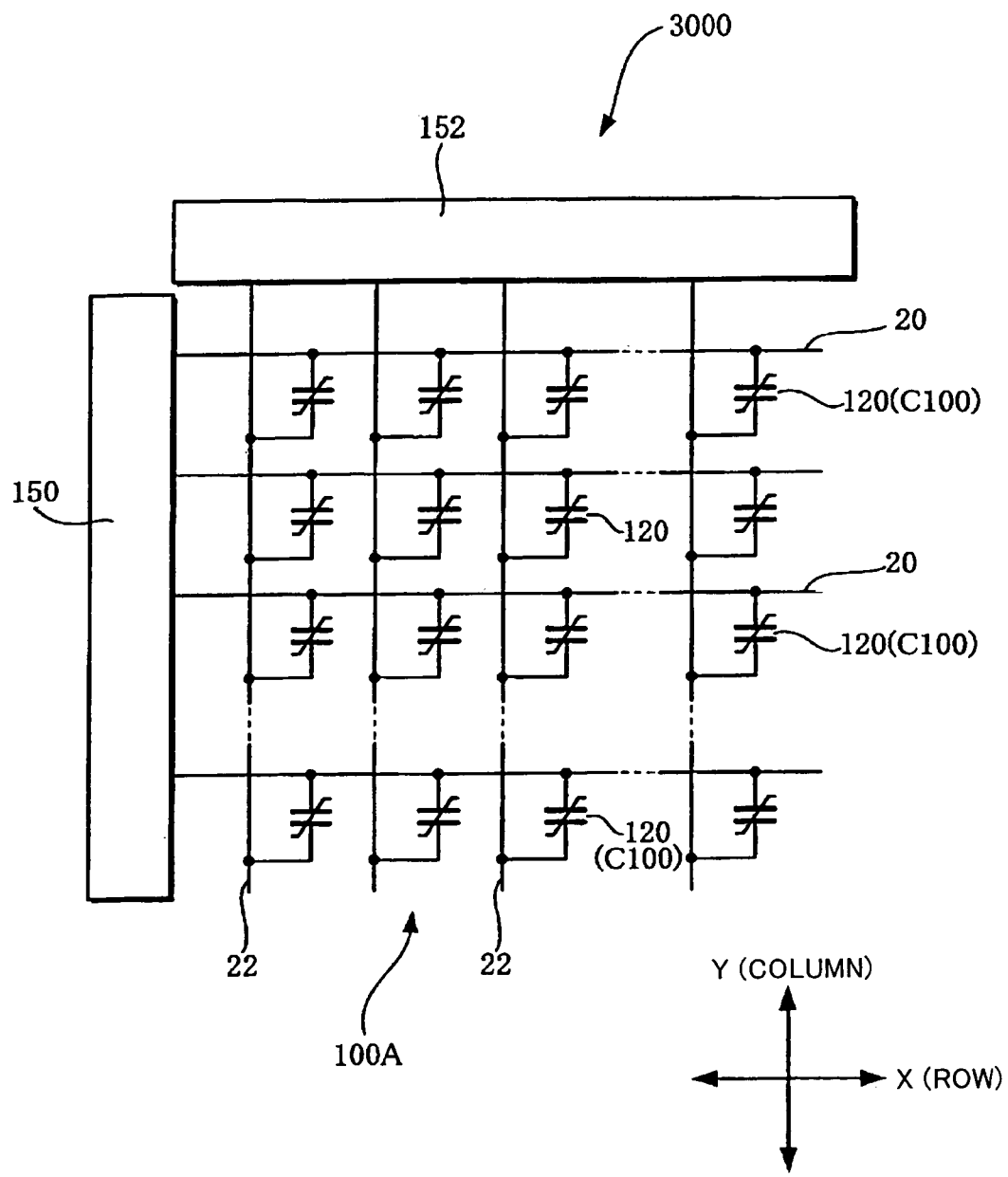
FIG. 17 shows a ferroelectric memory according to a third example of the other embodiment of the present invention.
Figure 18:
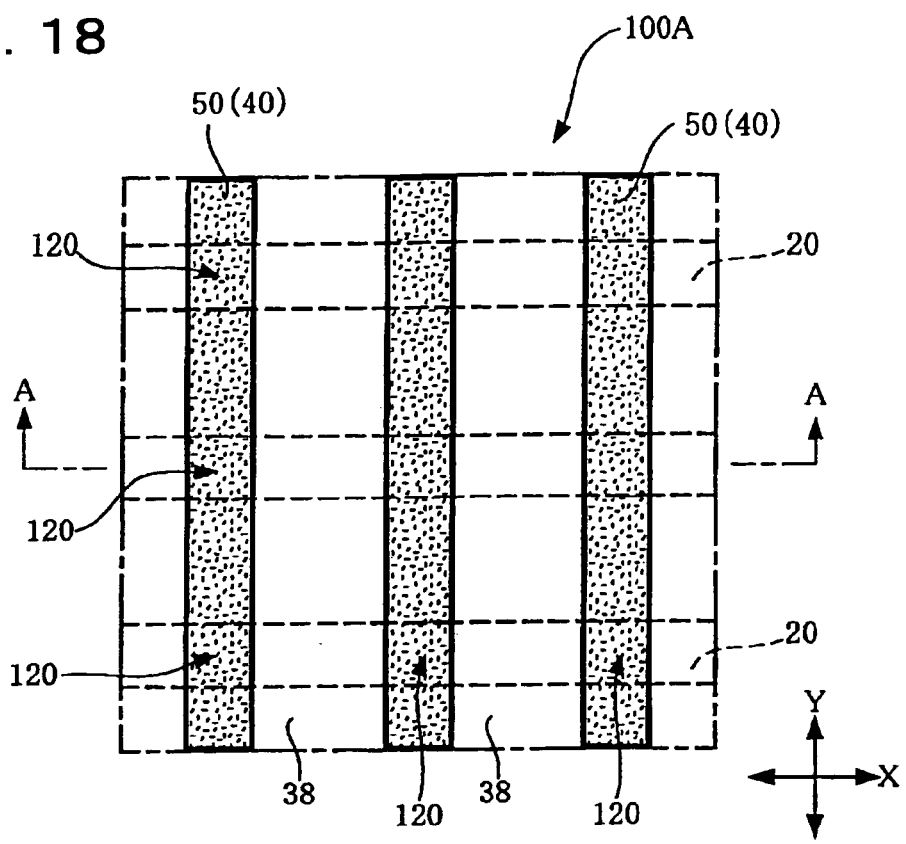
FIG. 18 shows the ferroelectric memory according to the third example of the other embodiment of the present invention.
Figure 19:
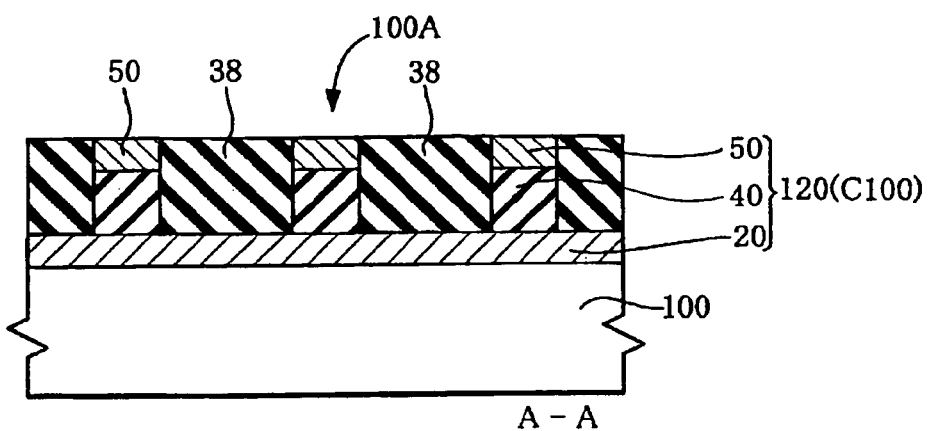
FIG. 19 shows the ferroelectric memory according to the third example of the other embodiment of the present invention.

FIG. 17 schematically shows a ferroelectric memory 3000. FIG. 18 is an enlarged plan view showing a part of a memory cell array. FIG. 19 is a cross-sectional view along the line A—A shown in FIG. 17. In the plan view, a numeral in parentheses indicates a layer under the uppermost layer.

As shown in FIG. 17, a ferroelectric memory 3000 in this example includes a memory cell array 100A in which memory cells 120 are arranged in the shape of a simple matrix, and various circuits for selectively writing or reading data in or from the memory cell 120 (ferroelectric capacitor C100), such as a first driver circuit 150 for selectively controlling the first signal electrode (first electrode) 20, a second driver circuit 152 for selectively controlling the second signal electrode (second electrode) 50, and a signal detection circuit such as a sense amplifier (not shown).

In the memory cell array 100A, the first signal electrodes (wordlines) 20 for selecting the row and the second signal electrodes (bitlines) 50 for selecting the column are arranged to intersect at right angles. Specifically, the first signal electrodes 20 are arranged at a specific pitch along the X direction. The second signal electrodes 50 are arranged at a specific pitch along the Y direction which intersects the X direction at right angles. The configuration of the signal electrodes may be the reverse of that described above. Specifically, the first signal electrode may be the bitline and the second signal electrode may be the wordline.

In the memory cell array 100A according to the present embodiment, the first signal electrode 20, the ferroelectric film 40 according to the present invention, and the second signal electrode 50 are stacked on the insulating base 100, as shown in FIGS. 18 and 19. The first signal electrode 20, the ferroelectric film 40 formed by applying the above-described manufacturing method, and the second signal electrode 50 make up the ferroelectric capacitor 120. Specifically, a memory cell including the ferroelectric capacitor 120 is formed in the intersecting region of the first signal electrode 20 and the second signal electrode 50.

A dielectric layer 38 is formed between laminates consisting of the ferroelectric film 40 and the second signal electrode 50 so as to cover exposed surfaces of the base 100 and the first signal electrode 20. The dielectric layer 38 preferably has a dielectric constant lower than the dielectric constant of the ferroelectric film 40. The floating capacitance of the first and second signal electrodes 20 and 50 can be reduced by allowing the dielectric layer 38 having a dielectric constant lower than that of the ferroelectric film 40 to be formed between the laminates consisting of the ferroelectric film 40 and the second signal electrode 50. As a result, the read and write operations of the ferroelectric memory 3000 can be performed at a higher speed.

An example of the read and write operations of the ferroelectric memory 3000 is described below.

In the read operation, a read voltage "$V_0$" is applied to the capacitor in the selected cell. This also serves as a write operation of "0". At this time, current flowing through the selected bitline or a potential when causing the bitline to be in a high impedance state is read by the sense amplifier. A given voltage is applied to the capacitors in the unselected cells in order to prevent occurrence of crosstalk during reading.

In the write operation of "1", a voltage "$-V_0$" is applied to the capacitor in the selected cell. In the case of writing "0", a voltage which does not cause polarization reversal of the selected cell is applied to the capacitor in the selected cell, whereby the "0" state written during the read operation is maintained. A given voltage is applied to the capacitors in the unselected cells in order to prevent occurrence of crosstalk during writing.

The above-described ferroelectric memory includes a ferroelectric capacitor including a ferroelectric film having excellent crystal structure. Therefore, the present embodiment can provide a highly reliable ferroelectric memory.

Examples of the storage capacitance type, MIS transistor type, and simple matrix type ferroelectric memories are described above. However, the ferroelectric memory of the present invention is not limited thereto. The ferroelectric memory of the present invention may be applied to other types of memory transistors.

4. Piezoelectric Device and Ink-Jet Recording Head

A case where the ferroelectric film of the present embodiment is applied to a piezoelectric device is described below. The present embodiment illustrates the case where the ferroelectric film is applied to a piezoelectric device of an ink-jet recording head.

As an ink-jet recording head in which a part of a pressure generating chamber connected with a nozzle orifice from which an ink droplet is ejected is formed by using a diaphragm, and an ink droplet is ejected from the nozzle orifice by pressurizing the ink in the pressure generating chamber by deforming the diaphragm using a piezoelectric device, an ink-jet recording head using a longitudinal vibration mode piezoelectric actuator which expands and contracts in the axial direction of the piezoelectric device, and an ink-jet recording head using a flexural vibration mode piezoelectric actuator have been put into practical use.

As an ink-jet recording head using the flexural vibration mode actuator, an ink-jet recording head obtained by forming a uniform piezoelectric layer over the entire surface of the diaphragm by using the deposition technology, and cutting the piezoelectric layer into a shape corresponding to the pressure generating chamber using a lithographic method so that the piezoelectric device is independently formed in units of the pressure generating chambers has been known.

Figure 20:
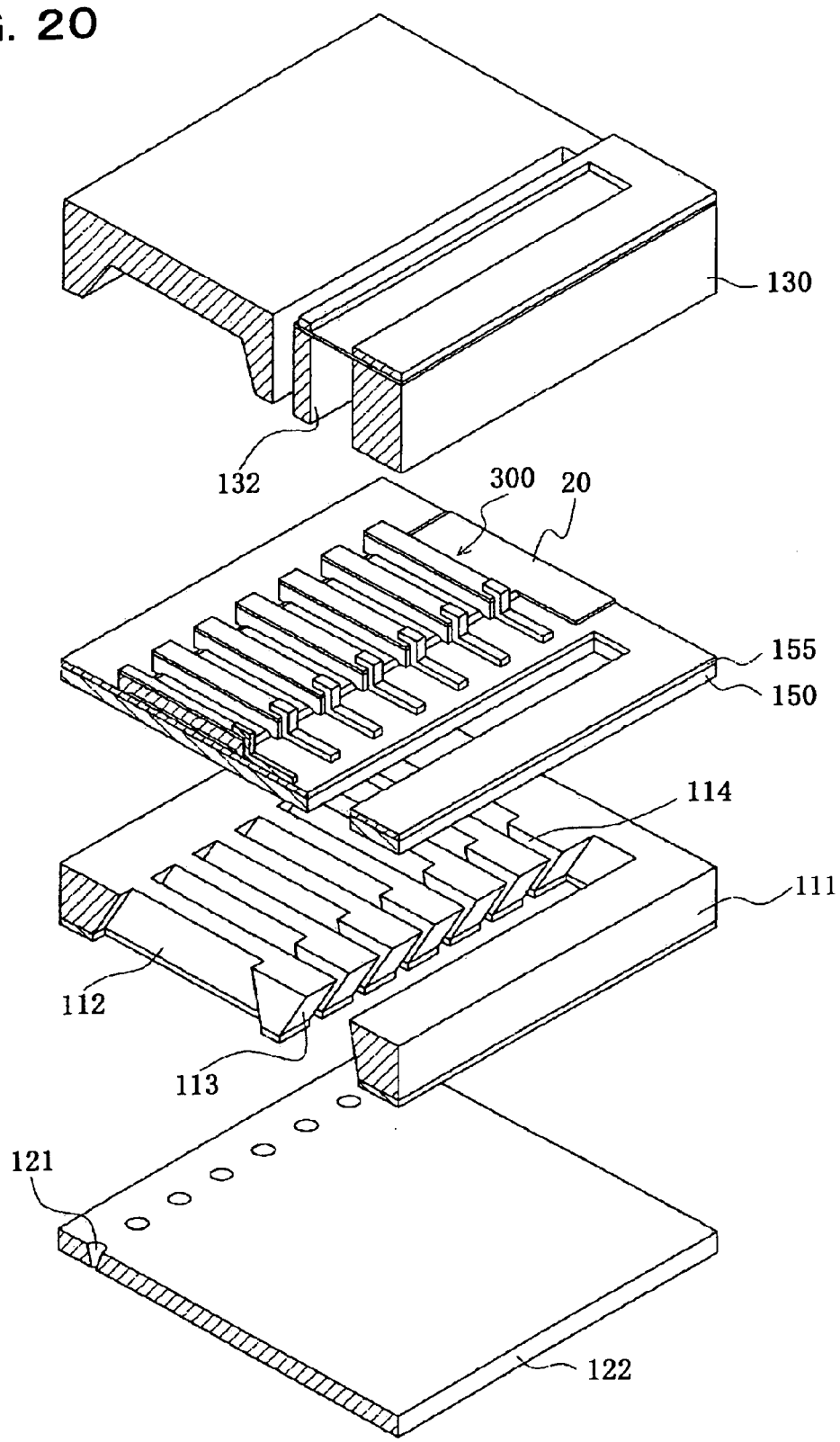
FIG. 20 is an exploded perspective view of a recording head according to a further embodiment of the present invention.
Figure 21A:
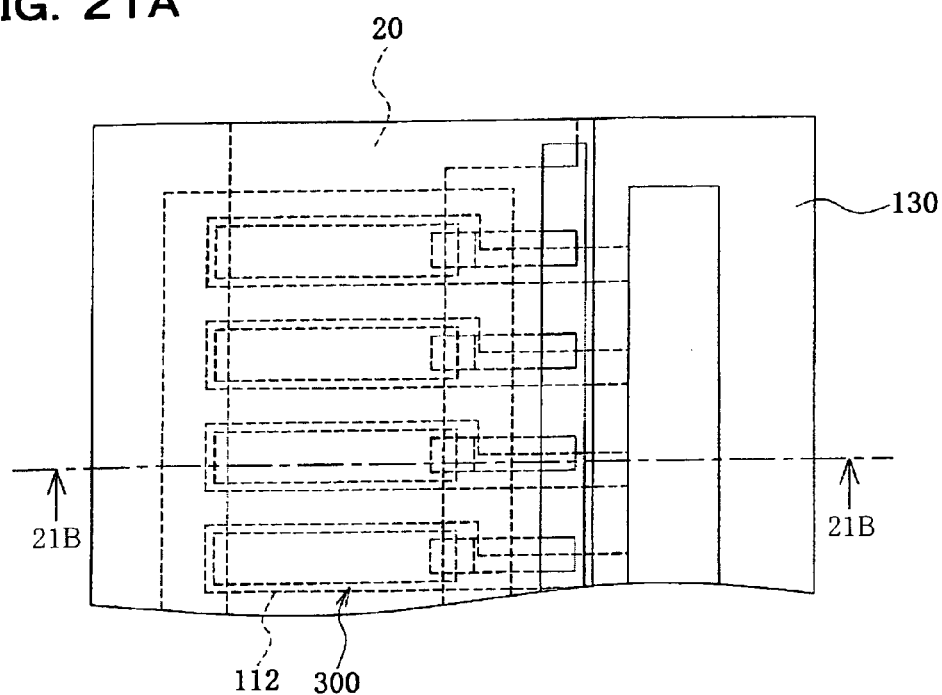
FIG. 21A is a plan view of the recording head according to the further embodiment of the present invention.
Figure 21B:
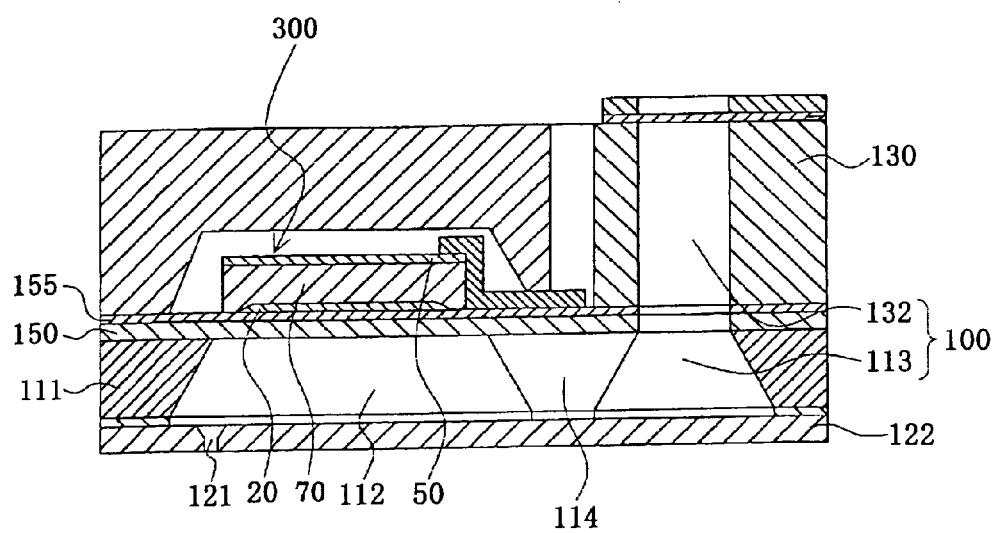
FIG. 21B is a cross-sectional view of the recording head according to the further embodiment of the present invention.
Figure 22:
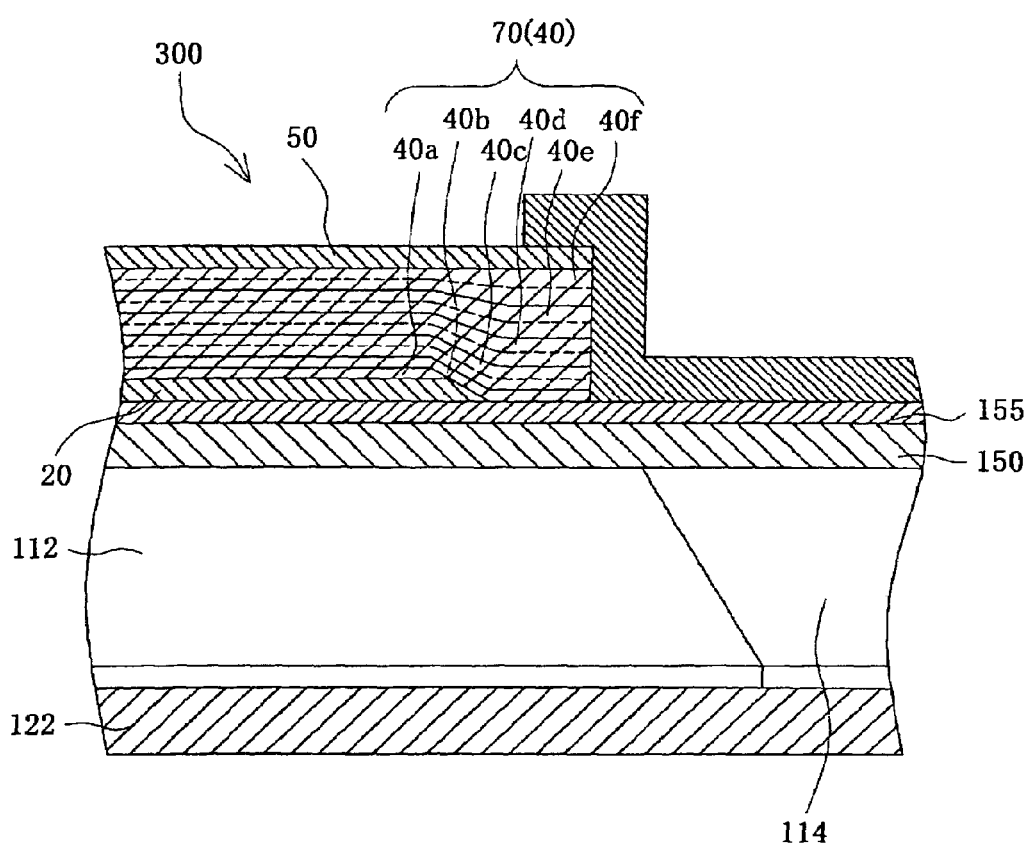
FIG. 22 is a schematic diagram showing a layer structure of a piezoelectric device according to a still further embodiment of the present invention.

FIG. 20 is an exploded perspective view showing an outline of an ink-jet recording head according to the embodiment of the present invention. FIGS. 21A and 21B are respectively a plan view and a cross-sectional view of the recording head shown in FIG. 20. FIG. 22 is a schematic diagram showing a layer structure of a piezoelectric device 3000. As shown in the drawings, a channel forming substrate 111 is formed of a (110)-oriented silicon single crystal substrate, and an elastic film 150 with a thickness of 1 μm to 2 μm, which is made of silicon dioxide formed in advance using thermal oxidation, is formed on one side of the channel forming substrate 111. A plurality of pressure generating chambers 112 are disposed in the channel forming substrate 111 in parallel in the widthwise direction. A communication section 113 is formed in the channel forming substrate 111 in the region outside the pressure generating chamber 112 in the longitudinal direction. The communication section 113 is connected with the pressure generating chambers 112 through ink supply paths 114 provided in units of the pressure generating chambers 112. The communication section 113 is connected with a reservoir section 132 of a sealing substrate 130 described later to make up a part of a reservoir 100 as a common ink chamber for the pressure generating chambers 112. The ink supply path 114 is formed to have a width smaller than the width of the pressure generating chamber 112, and uniformly maintains channel resistance of the ink which flows into the pressure generating chamber 112 from the communication section 113.

A nozzle plate 122, in which nozzle orifices 121 connected with the pressure generating chambers 112 near the edge opposite to the ink supply path 114 are formed, is secured to the channel forming substrate 111 on the opening side through an adhesive, a thermal-deposited film, or the like.

The elastic film 150 with a thickness of about 1.0 μm is formed on the channel forming substrate 111 on the side opposite to the opening side as described above. An insulator film 155 with a thickness of about 0.4 μm is formed on the elastic film 150. A lower electrode film 20 with a thickness of about 0.2 μm, a piezoelectric layer 70 with a thickness of about 1.0 μm, and an upper electrode film 50 with a thickness of about 0.05 μm are stacked on the insulator film 155 using a process described later to make up the piezoelectric device 300. The piezoelectric device 300 is a section including the lower electrode film 20, the piezoelectric layer 70, and the upper electrode film 50. Generally, one of the electrodes of the piezoelectric device 300 is used as a common electrode, and the other electrode and the piezoelectric layer 70 are patterned in units of the pressure generating chambers 112. A section which is formed by the patterned electrode and piezoelectric layer 70 and in which a piezoelectric strain occurs by applying a voltage between the electrodes is called a piezoelectric active section. In the present embodiment, the lower electrode film 20 is used as the common electrode for the piezoelectric devices 300, and the upper electrode film 50 is used as the individual electrodes for the piezoelectric devices 300. However, the electrode configuration may be the reverse of the above electrode configuration depending on the configuration of the driver circuit or interconnects. In either case, the piezoelectric active sections are formed in units of the pressure generating chambers. The piezoelectric device 300 and the diaphragm, which is displaced due to drive of the piezoelectric device 300, are collectively called a piezoelectric actuator. The piezoelectric layer 70 is independently provided in units of the pressure generating chambers 112. As shown in FIG. 22, the piezoelectric layer 70 is made up of a plurality of ferroelectric film layers 40 (40a to 40f).

Figure 23:
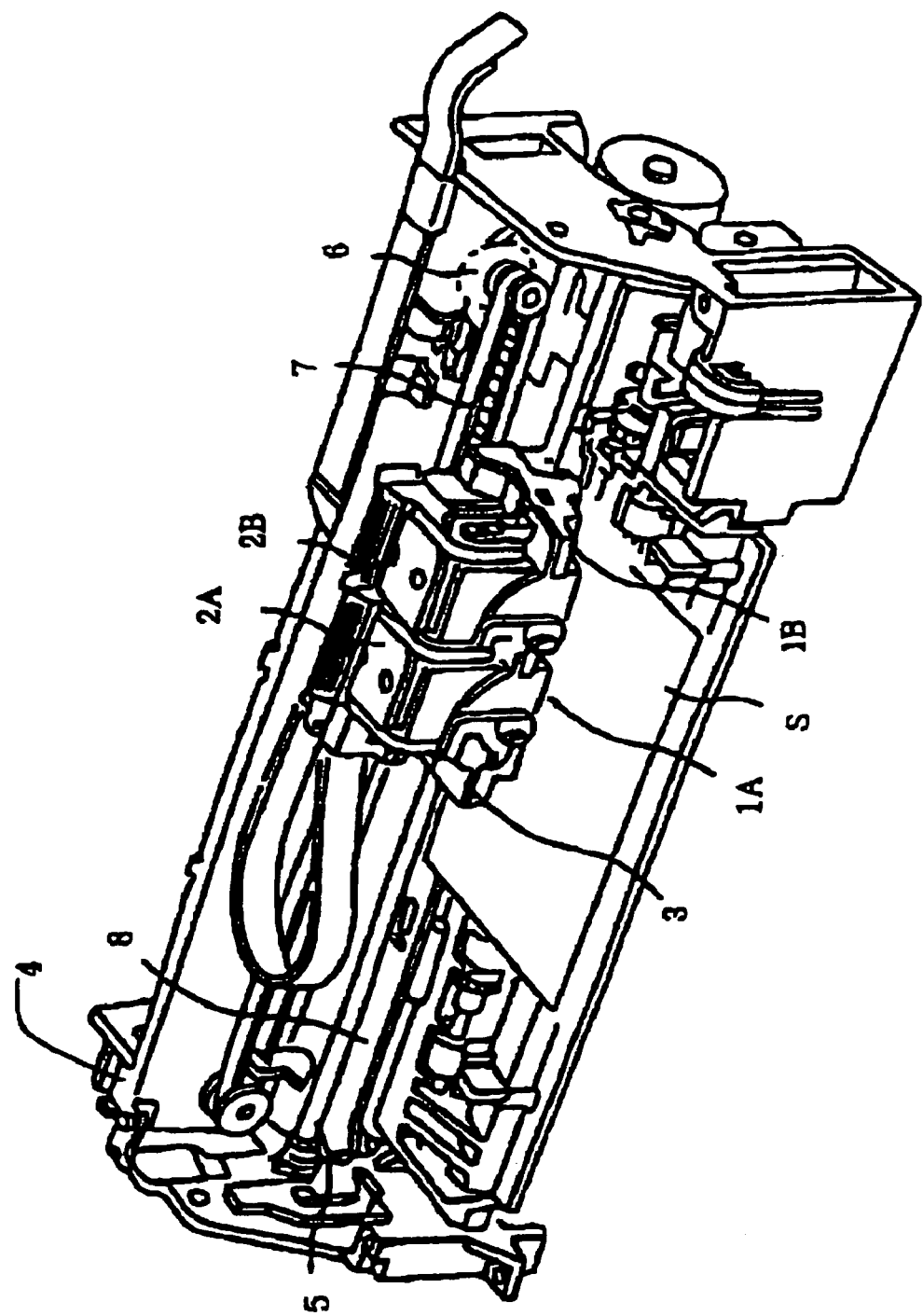
FIG. 23 is a schematic diagram showing an example of an ink-jet recording device according to a yet further embodiment of the present invention.

The ink-jet recording head makes up a part of a recording head unit including an ink channel connected with an ink cartridge or the like, and is provided in an ink-jet recording device. FIG. 23 is a schematic diagram showing an example of the ink-jet recording device. As shown in FIG. 23, cartridges 2A and 2B which make up ink supply means are removably provided to recording head units 1A and 1B, each including an ink-jet recording head. A carriage 3 provided with the recording head units 1A and 1B is provided to a carriage shaft 5 attached to a device body 4 so as to be able to move freely in the axial direction. The recording head units 1A and 1B respectively eject a black ink composition and a color ink composition, for example. The driving force of a drive motor 6 is transferred to the carriage 3 through a plurality of gear wheels (not shown) and a timing belt 7, whereby the carriage 3 carrying the recording head units 1A and 1B is moved along the carriage shaft 5. A platen 8 is provided in the device body 4 along the carriage shaft 5. A recording sheet S as a recording medium such as paper fed by using a paper feed roller (not shown) or the like is transferred onto the platen 8.

The above description illustrates the ink-jet recording head which ejects ink as a liquid jet head as an example. However, the present invention aims at a liquid jet head using a piezoelectric device and a liquid jet device in general. As the liquid jet head, a recording head used for an image recording device such as a printer, a color material jet head used for manufacturing a color filter for a liquid crystal display or the like, an electrode material jet head used for forming an electrode of an organic EL display, a field emission display (FED), or the like, a bio-organic substance jet head used for manufacturing a bio-chip, and the like can be given.

Since the piezoelectric device of the present embodiment uses the PZTN film according to the above embodiment as the piezoelectric layer, the following effects are obtained.

(1) Since covalent bonding properties in the piezoelectric layer are improved, the piezoelectric constant can be increased.

(2) Since vacancies of PbO in the piezoelectric layer can be reduced, occurrence of a heterophase at the interface between the piezoelectric layer and the electrode is prevented, whereby an electric field is easily applied. Therefore, efficiency of the piezoelectric device can be increased.

(3) Since a current leakage from the piezoelectric layer is reduced, the thickness of the piezoelectric layer can be reduced.

Since the liquid jet head and the liquid jet device of the present embodiment utilize the above piezoelectric device, the following effect is obtained.

(4) Since fatigue deterioration of the piezoelectric layer can be reduced, a change in the amount of displacement of the piezoelectric layer over time can be decreased, whereby reliability can be improved.

What is claimed is:

1. A ferroelectric material for forming a ferroelectric that is described by a general formula $ABO_3$, the ferroelectric material comprising lead zirconate titanate which constitutes an A-site compensation component which compensates for a vacancy of an A site, and a B-site compensation component which compensates for a vacancy of a B site, wherein each of the A-site compensation component and the B-site compensation component comprises an oxide material including at least Si and Ge, wherein the A-site compensation component includes an element which becomes divalent and an element which becomes trivalent, and wherein the B-site compensation component includes an element which becomes pentavalent.

2. The ferroelectric material as defined in claim 1, wherein a lanthanoid series element is added as the element which becomes a trivalent state.

3. A method of manufacturing a ferroelectric film, comprising using the ferroelectric material as defined in claim 1.

4. The method of manufacturing a ferroelectric film as defined in claim 3, comprising:

forming a ferroelectric material film by stacking a plurality of raw material layers using the ferroelectric material; and performing a heat treatment for forming initial crystal nuclei in each of the raw material layers.

5. The method of manufacturing a ferroelectric film as defined in claim 4, wherein the heat treatment is performed by using a rapid thermal annealing method.

6. The method of manufacturing a ferroelectric film as defined in claim 3, wherein the ferroelectric film is formed by crystallizing the ferroelectric material film by applying a heat treatment to the ferroelectric material film.

7. A method of manufacturing a ferroelectric capacitor including forming a lower electrode, a ferroelectric film and an upper electrode on a base, the method comprising:

forming a ferroelectric material film by stacking a plurality of raw material layers using the ferroelectric material as defined in claim 1; and performing a heat treatment for forming initial crystal nuclei in each of the raw material layers.

8. The method of manufacturing a ferroelectric capacitor as defined in claim 7, wherein the heat treatment is performed by using a rapid thermal annealing method.

9. The method of manufacturing a ferroelectric capacitor as defined in claim 7, wherein the ferroelectric film is formed by crystallizing the ferroelectric material film by applying a heat treatment to the ferroelectric material film.

10. A ferroelectric capacitor manufactured by using the method of manufacturing a ferroelectric capacitor as defined in claim 7.

11. A ferroelectric memory comprising the ferroelectric capacitor as defined in claim 10.

12. A piezoelectric device comprising the ferroelectric capacitor as defined in claim 10.

* * * * *